United States Patent [19]

Tateiwa

[11] Patent Number: 5,108,953
[45] Date of Patent: Apr. 28, 1992

[54] METHOD FOR FABRICATING A SEMICONDUCTIVE DEVICE COMPRISING A REFRACTORY METAL SILICIDE THIN FILM

[75] Inventor: Kenji Tateiwa, Osaka, Japan

[73] Assignee: Matsushita Electric Industrial Co., Ltd., Osaka, Japan

[21] Appl. No.: 473,526

[22] Filed: Feb. 1, 1990

[30] Foreign Application Priority Data

Feb. 2, 1989 [JP] Japan .................. 1-24190

[51] Int. Cl.$^5$ .............................. H01L 21/477
[52] U.S. Cl. ........................ 437/200; 437/201; 437/247; 148/DIG. 3; 148/DIG. 147
[58] Field of Search .............. 437/200, 201, 247; 148/DIG. 3, DIG. 147

[56] References Cited

U.S. PATENT DOCUMENTS

| | | | |
|---|---|---|---|
| 4,551,908 | 11/1985 | Nagasawa et al. | 437/200 |
| 4,566,021 | 1/1986 | Yakoyama | 357/67 |
| 4,777,150 | 10/1988 | Deneuville et al. | 437/200 |
| 4,860,086 | 8/1989 | Nakamura et al. | 357/71 |

FOREIGN PATENT DOCUMENTS 63-300566 12/1988 Japan .

OTHER PUBLICATIONS

Full text of Jun-ru.
Full text of Chang.
C. D. Rude et al, "Characterization of NbSi$_2$ Thin Films", *Journal of Applied Physics*, vol. 53, No. 8 Aug. 1982 pp. 5703–5709.
T. P. Chow et al, "The Effect of Annealing on the Properties of Silicidized Molybdenum Thin Films", *Journal of Applied Physics* vol. 52(10) Oct. '81 pp. 6331–6336.
S. T. Chang et al, "Effects of TiSalicide Process on MOSFET Characteristics" *IEEE Transactions of Election Devices*, vol. 36, No. 1, pt 1 pp. 145–147, Jan. '89.
X. Q. Jun-ru, "An Ivestigation of a Novel Method for Forming Ti Silicide," *Acta Electron. Sin.*, vol. 15, No. 3, May (1987) pp. 15–21.
"Morphological Degradation of TiSi$_2$ on (100) Silicon" by Revesz et al; Appl. Phys. Lett. 48(23), Jun. 9, 1986; pp. 1591–1593.

*Primary Examiner*—Brian E. Hearn
*Assistant Examiner*—Laura M. Holtzman
*Attorney, Agent, or Firm*—Lowe, Price, LeBlanc & Becker

[57] ABSTRACT

A method for fabricating a semiconductive device is described, wherein a semiconductive substrate having a thermally shrinkable, refractory metal silicide thin film is provided, on which an insulating film on the metal silicide thin film is formed. The metal silicide thin film is thermally treated in an atmosphere containing hydrogen. By this, no morphological degradation is observed in the silicide thin film without an increase of the resistance.

12 Claims, 5 Drawing Sheets $a_1$ ........................... $a_2$ $b_1$ ........................... $b_2$

METHOD FOR FABRICATING A SEMICONDUCTIVE DEVICE COMPRISING A REFRACTORY METAL SILICIDE THIN FILM

BACKGROUND OF THE INVENTION

1. Field of the Invention

This invention relates to semiconductive devices and more particularly, to a method for fabricating a semiconductive device which is useful in application to high speed and high density integrated circuits.

2. Description of the Prior Art

In the MIS (metal-insulator semiconductor) type device using titanium silicide as part of the gate structure, e.g. a polycide gate structure, it is usual to subject the device to thermal treatment in an atmosphere of nitrogen after formation of the silicide in order to make wirings of low resistance. The main purpose for this is to lessen resistance caused by the growth of crystals of titanium silicide, to activate the source and drain regions of transistor, and to make a flat interlayer insulating layer by re-flow of the layer.

In the prior art technique, however, when the thermal treatment is effected in an atmosphere of nitrogen at temperatures not lower than 900° C., titanium silicide which is thermally instable and thermally shrinkable suffers morphological degradation, resulting in an increasing resistance of the wirings. This morphological degradation is described, for example, in Applied Physics Letter 48 (23) p. 1591 (1986). In addition, there is produced a great stress accompanied by the morphological degradation, causing a large quantity of interface levels to be produced in the interfaces of the MIS semiconductor and thus degrading the transistor characteristics.

For preventing the morphological degradation during the thermal treatment of titanium silicide, there are known two improvements: (1) an impurity is incorporated in the titanium silicide such as by ion implantation thereby improving the thermal stability of the silicide; and (2) an insulating film is formed on the titanium silicide film.

As for (1), nitrogen implantation into the silicide is described in Appl. Phys. Lett. referred to above, by which the stability of the silicide is stated as improved.

The formation of an insulating film on the titanium silicide film is described with reference to FIGS. 1a to 1d.

In FIG. 1a, there is shown a microphotograph showing morphological degradation of a titanium silicide film surface which has been subjected to thermal treatment at 900° C. for 120 minutes in an atmosphere of nitrogen without covering with an NSG (non-doped silicide glass) film prior to patterning to form a polycide wiring. FIG. 1b is a microphotograph showing morphological degradation of a titanium silicide film surface which has been subjected to thermal treatment in an atmosphere of nitrogen under the same conditions as stated above but covered with a 150 nm thick NSG film on the film surface. In FIGS. 1c and 1d, there are, respectively, shown sectional views taken along the lines $a_1-a_2$ and $b_1-b_2$ of FIGS. 1a and 1b. As will be apparent from FIG. 1c, the thermal treatment in a nitrogen atmosphere makes an irregular titanium silicide surface although the covering with the NSG film mitigates the degree of irregularily to an extent as is particularly shown in FIG. 1d.

However, the surface morphology is not improved by these known techniques to a satisfactory extent.

SUMMARY OF THE INVENTION

It is an object of the invention to provide a method for fabricating a semiconductive device having a titanium silicide film which is thermally treated in an atmosphere containing hydrogen whereby the morphological degradation of the refractory metal silicide can be suppressed to an appreciable extent and the resistance of the silicide pattern can be prevented from increasing.

It is another object of the invention to provide a method for fabricating a MIS-type device wherein the interface level at the MIS device can be suppressed to a satisfactory extent by the effect of the thermal treatment in a hydrogen-containing gas atmosphere.

The above object can be achieved, according to the invention, by a method for fabricating a semiconductive device which comprises providing a semiconductive substrate having a thermally shrinkable, refractory metal silicide thin film, forming an insulating film on the metal silicide thin film, and thermally treating the metal silicide thin film in an atmosphere containing hydrogen. The thermal treatment is preferably effected at a temperature of from 800° to 1000° C. at a reduced pressure of from 100 to 1000 Torr. Moreover, the thermal treatment is preferably carried out prior to patterning of the silicide film.

DETAILED DESCRIPTION AND EMBODIMENTS OF THE INVENTION

Figure 1A:
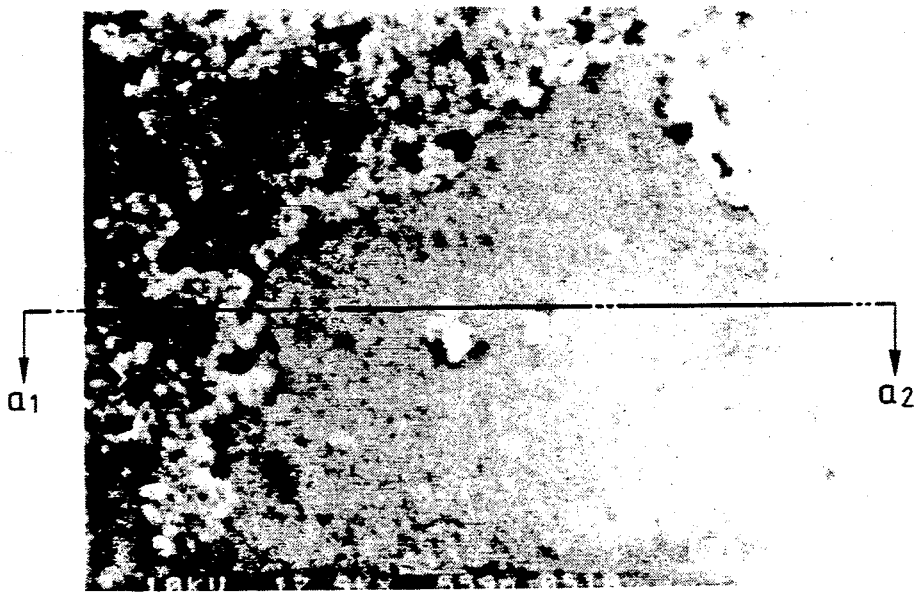
FIGS. 1a and 1b are, respectively, microphotographs of titanium silicide films thermally treated in an atmosphere of nitrogen prior to and after formation of an insulating film on the silicide film
Figure 1B:
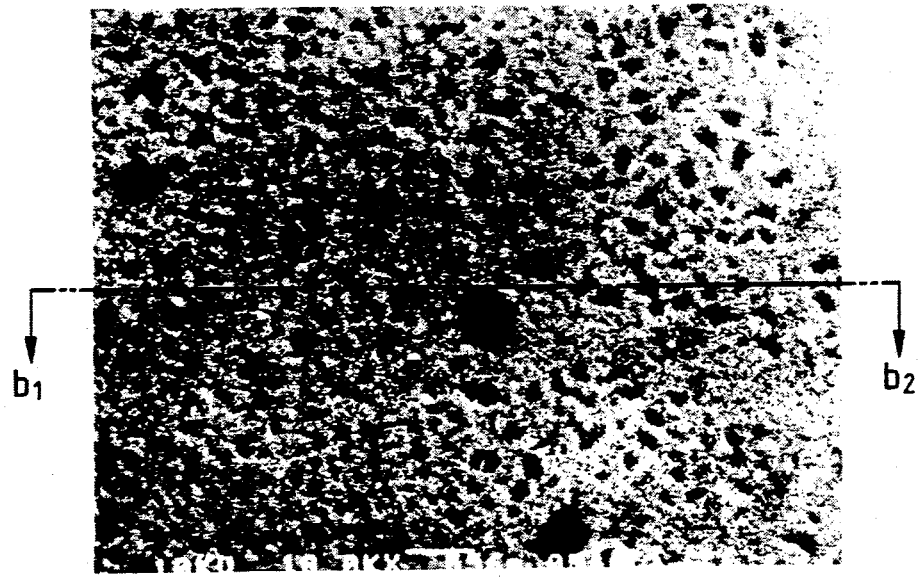
Figure 1C:
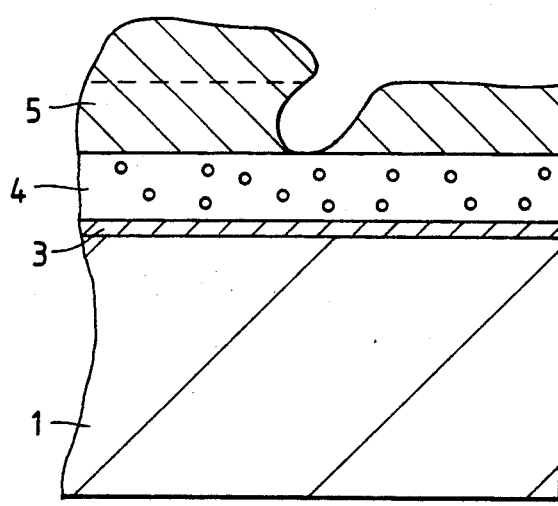
FIGS. 1c and 1d are, respectively, sectional views takne along the line $a_1-a_2$ of FIG. 1a and the line $b_1-b_2$ of FIG. 1b.

Reference is now made to the accompanying drawings and particularly, to FIGS. 2a to 2e wherein like reference numerals indicate like parts or members. In the figures, there are shown the steps of fabricating a MOS-type transistor.

Figure 2A:
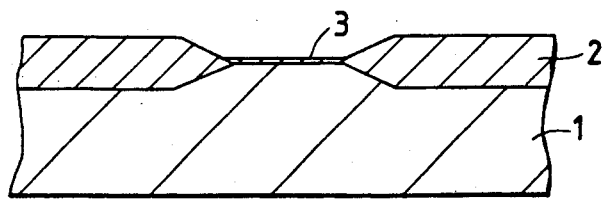
FIGS. 2a to 2e are, respectively, schematic views showing the steps of a fabrication method of a semiconductive device according to one embodiment of the invention.

In FIG. 2a, there is shown a silicon substrate 1 having a LOCOS oxide film 2 formed in position according to the LOCOS (local oxidation of silicon) procedure. On the substrate 1 is formed a gate oxide film 3 according to a thermal oxidation process as shown.

Figure 2B:
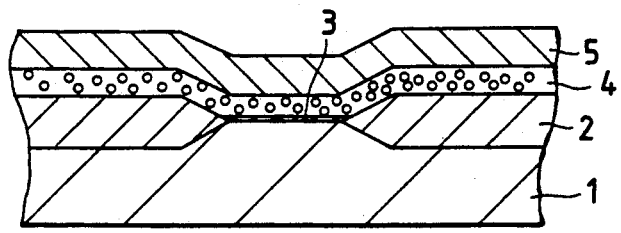

In FIG. 2b, polysilicon is deposited over the films 2 and 3 according to a reduced pressure CVD process in a desired thickness. This polysilicon is thermally treated in an atmosphere of, for example, $POCl_3$ thereby forming a conductive polysilicon layer 4 as shown. The thermal treatment is known in the art and is effected, for example, under conditions of a temperature of from 800° to 1000° C. Subsequently, the polysilicon layer-bearing substrate is subjected to sputtering of a titanium silicide target to form a titanium silicide layer 5 on the polysilicon layer 4.

Figure 1D:
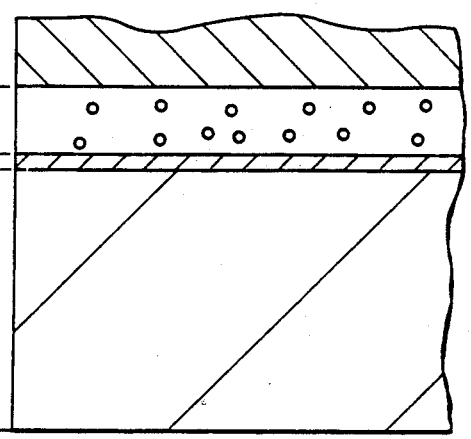
Figure 2C:
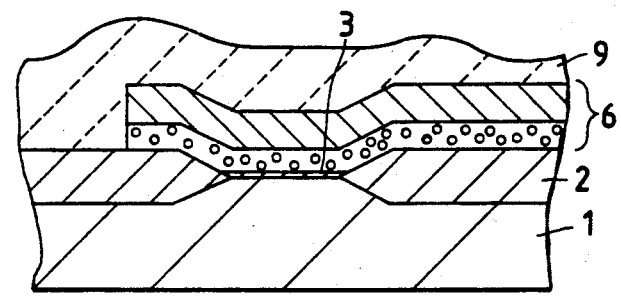
Figure 2D:
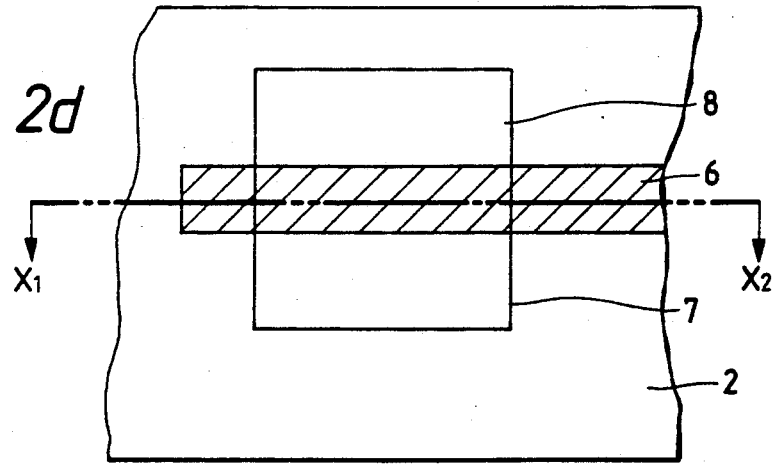

FIG. 2c shows patterning of the polysilicon layer 4 and the titanium silicide layer 5 by a lithographic or dry etching technique to make a polycide wiring 6 with a desired form having a composite structure of the polysilicon layer 4 and the titanium silicide layer 5. Thereafter, a source 7 and a drain 8 of the transistor are formed as shown in FIG. 2d by an ion implantation method, followed by forming an interlayer insulating film 9 is deposited as shown in FIG. 2c. It will be noted that FIG. 2c is a section taken along the line $X_1$-$X_2$ of FIG. 1d.

The next step is important in the practice of the invention wherein the deposited substrate is subjected to thermal treatment in an atmosphere of a mixed gas comprising hydrogen as a constituent gas or in a pyrogenic atmosphere. This mixed gas is generally a mixture of hydrogen and oxygen gases at a mixing ratio of the hydrogen and oxygen gases of 0.1 to 2:1 by volume. The thermal treatment should preferably be carried out at a temperature of from 800° to 1000° C. for a time of from 15 to 200 hours. By the treatment, the gate wiring is made low in resistance and the source 7 and the drain 8 are activated. Since the thermal treatment is effected in an atmosphere containing hydrogen, morphological degradation of the silicide surface does not take place.

Figure 2E:
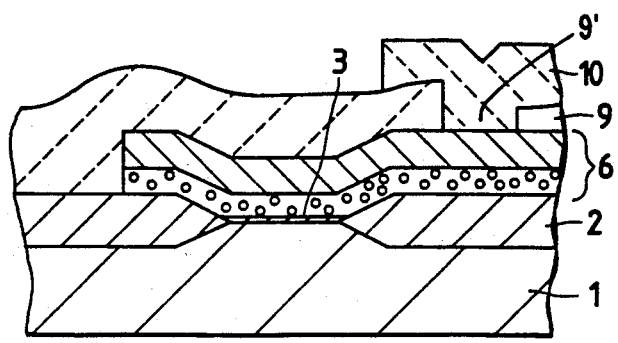

In FIG. 2e, the insulating film 9 is formed with a through-hole 9' which reaches the polycide wiring 6 according to any known technique. A metal such as aluminum is filled in the through-hole 9' to form a metal wiring 10. By the above procedure, a MOS transistor is substantially completed.

Figure 3A:
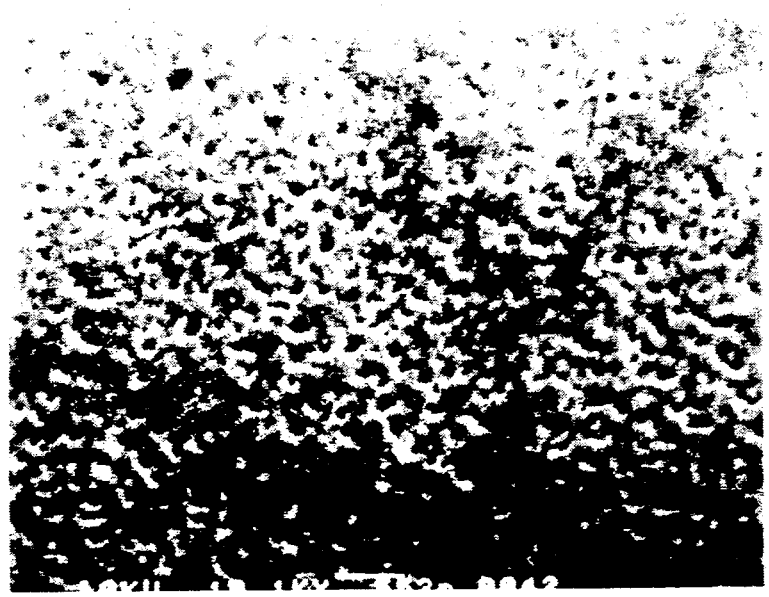
FIG. 3A is a microphotograph of a titanium silicide film annealed or thermally treated in an atmosphere of nitrogen.
Figure 3B:
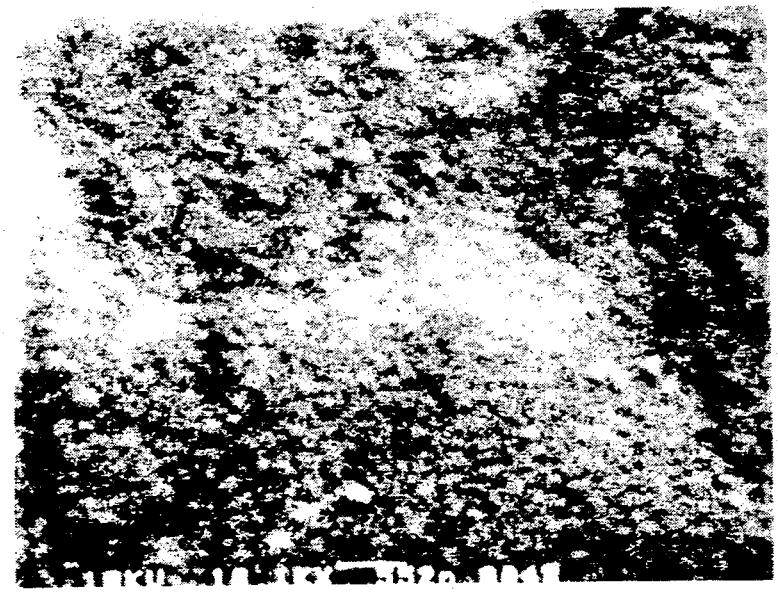
FIG. 3B is a microphotograph of a titanium silicide film annealed or thermally treated in a pyrogenic atmosphere of a mixed gas of hydrogen and oxygen at a hydrogen:oxygen ratio of 8:9.

In FIGS. 3a and 3b, there are shown microphotographs of the surfaces of the titanium silicide, like FIG. 2b, thermally treated in an atmosphere of nitrogen and a pyrogenic atmosphere of hydrogen and oxygen at a mixing ratio of 8:9 by volume at a temperature of 900° C. for 60 minute prior to the formation of the polycide wiring 6 by patterning, respectively.

As will be from FIG. 3a where the atmosphere is of nitrogen, the titanium silicide is thermally shrunk with a substantial degree of the surface degradation. On the other hand, no morphological degradation is observed for the pyrogenic atmosphere as shown in 3b.

Figure 4A:
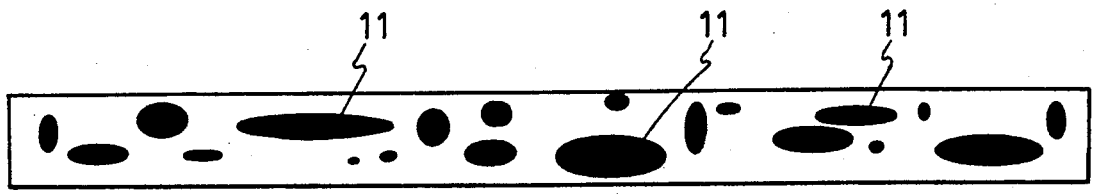
FIG. 4A is a schematic view of the surface of a titanium silicide wiring annealed in an atmosphere of nitrogen and FIG. 4B is a schematic view of the surface of a titanium silicide wiring thermally treated in a pyrogenic atmosphere of a mixed gas of hydrogen and oxygen at a hydrogen:oxygen ratio of 8:9.
Figure 4B:
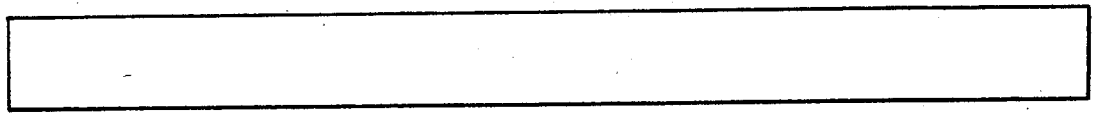

FIGS. 4a and 4b schematically shown possible titanium silicide wiring surfaces after thermal treatment in an atmosphere of nitrogen and in the pyrogenic atmosphere under the same conditions of 900° C. and 60 minutes as used with regard to those of FIGS. 3a and 3b, respectively. Since the titanium silicide is thermally shrunk and thus, voids 11 are produced with an increasing resistance as is shown in FIG. 4a. With the case of the invention wherein the thermal treatment is effected in the pyrogenic atmosphere under conditions of 900° C. and 60 minutes, little or no void is produced as is schematically shown in FIG. 4b without an increase of the resistance.

If the thermal treatment is effected after patterning, tensile stress is produced along the direction of the patterning with an increasing possibility that voids are formed in the wiring. Accordingly, it is preferred that the thermal treatment is carried out prior to the formation of the polycide wiring 6 by patterning by which formation of voids can be reduced to a significant extent.

Figure 5:
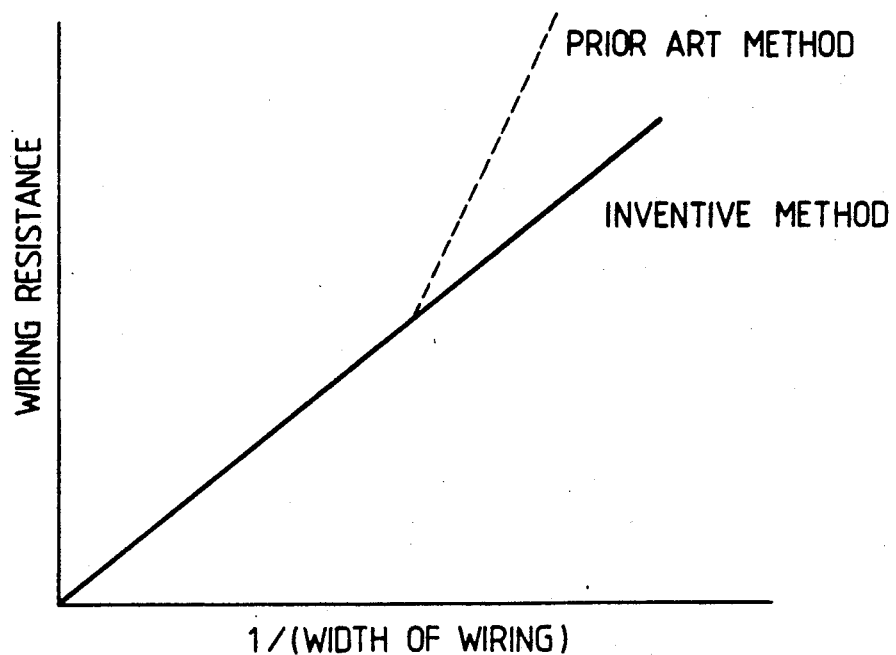
FIG. 5 is a graphical representation of a resistance of wiring in relation to the variation in the reciprocal of width of the wiring.

FIG. 5 shows the resistance of the titanium silicide wiring in relation to the reciprocal of wiring width. In the figure, a broken line indicates the case where the thermal treatment is carried out in an atmosphere of nitrogen according to the known procedure. This reveals that the relationship between the wiring resistance and the reciprocal of wiring width is deviated from a straight line as shown. On the other hand, the solid line indicates the case where the thermal treatment is effected according to the invention in an atmosphere containing hydrogen gas prior to formation of the wiring by patterning. Since no void is formed as is shown in FIG. 4b, the relationship between the wiring resistance and the reciprocal becomes straight.

Thus, the method of the invention is very advantageous from the characteristic standpoint.

It should be noted that while titanium silicide ($TiSi_2$) is used in the above description, other thermally shrinkable metal silicides such as $CoSi_2$, $NiSi_2$, $CrSi_2$, $PdSi_2$ and the like may likewise be used. Of these, titanium silicide is preferred.

What is claimed is:

1. A method for fabricating a semiconductive device which comprises providing a semiconductive substrate having a thermally shrinkable, refractory metal silicide thin film, forming an insulating film on the metal silicide thin film, and thermally treating the metal silicide thin film in an atmosphere containing hydrogen, the thermal treatment being effected at a temperature of from 800° C. to 1000° C. at a reduced pressure of from 100 to 1000 Torr, prior to formation of a metal wiring.

2. A method according to claim 1, further comprising patterning the insulating film and the silicide thin film in a desired form.

3. A method according to claim 2, wherein the thermal treatment is carried out prior to the patterning of the insulating film and the silicide thin film.

4. A method according to claim 1, wherein said atmosphere is of a mixed gas comprising hydrogen and oxygen.

5. A method according to claim 4, wherein the mixing ratio of hydrogen and oxygen is in the range of from 0.1 to 2:1 by volume.

6. A method according to claim 1, wherein said metal silicide thin film is a titanium silicide thin film.

7. A method according to claim 1, wherein said semiconductive device is a MIS device having the refractory metal silicide as part of a gate structure thereof wherein the metal silicide is thermally treated in an atmosphere containing hydrogen.

8. A method for fabricating a semiconductive device which comprises providing a semiconductive substrate having a thermally shrinkable, refractory metal silicide thin film, forming an insulating film on the metal silicide thin film, and thermally treating the metal silicide thin film in an atmosphere comprising hydrogen and oxygen wherein the mixing ratio of hydrogen and oxygen is in the range of from 0.1 to 2:1 by volume.

9. A method according to claim 8 further comprising patterning the insulating film and the silicide thin film in a desired form.

10. A method according to claim 9 wherein the thermal treatment is carried out prior to the patterning.

11. A method according to claim 8 wherein said metal silicide thin film is a titanium silicide thin film.

12. A method according to claim 8 wherein said semiconductive device is a MIS device having the refractory metal silicide as part of a gate structure.

* * * * *